(12) United States Patent
Wang et al.

(10) Patent No.: US 9,299,645 B2
(45) Date of Patent: Mar. 29, 2016

(54) SEMICONDUCTOR DEVICE HAVING LEAD FRAME WITH NOTCHED INNER LEADS

(71) Applicants: Lei Wang, Tianjin (CN); Liping Guo, Tianjin (CN); Jinsheng Wang, Tianjin (CN)

(72) Inventors: Lei Wang, Tianjin (CN); Liping Guo, Tianjin (CN); Jinsheng Wang, Tianjin (CN)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 14/551,075

(22) Filed: Nov. 23, 2014

(65) Prior Publication Data
US 2015/0279765 A1    Oct. 1, 2015

(30) Foreign Application Priority Data

Mar. 31, 2014  (CN) .......................... 2014 1 0191981

(51) Int. Cl.
| | | |
|---|---|---|
| *H01L 23/495* | (2006.01) | |
| *H01L 23/00* | (2006.01) | |
| *H01L 23/31* | (2006.01) | |

(52) U.S. Cl.
CPC .... *H01L 23/49503* (2013.01); *H01L 23/49541* (2013.01); *H01L 23/49544* (2013.01); *H01L 23/49551* (2013.01); *H01L 24/49* (2013.01); *H01L 23/3107* (2013.01); *H01L 24/32* (2013.01); *H01L 24/48* (2013.01); *H01L 24/73* (2013.01); *H01L 24/97* (2013.01); *H01L 2224/32245* (2013.01); *H01L 2224/48091* (2013.01); *H01L 2224/48177* (2013.01); *H01L 2224/48247* (2013.01); *H01L 2224/48465* (2013.01); *H01L 2224/73265* (2013.01); *H01L 2924/00014* (2013.01); *H01L 2924/181* (2013.01)

(58) Field of Classification Search
CPC ................ H01L 23/49541; H01L 23/49544; H01L 23/49551; H01L 23/3107
USPC .......................................................... 257/674
See application file for complete search history.

(56) References Cited

U.S. PATENT DOCUMENTS

| | | | | |
|---|---|---|---|---|
| 6,383,840 B1 * | 5/2002 | Hashimoto | ......... | H01L 21/4842 257/696 |
| 6,459,148 B1 * | 10/2002 | Chun-Jen | .......... | H01L 23/49551 257/666 |
| 6,670,222 B1 | 12/2003 | Brodsky | | |
| 6,803,648 B1 * | 10/2004 | Kelkar | ................ | H01L 23/3107 257/666 |
| 6,836,009 B2 * | 12/2004 | Koon | ...................... | H01L 25/50 257/692 |
| 7,238,551 B2 | 7/2007 | Kasem et al. | | |
| 7,719,094 B2 * | 5/2010 | Wu | ................... | H01L 23/49551 257/666 |
| 7,821,111 B2 | 10/2010 | Tellkamp | | |
| 7,977,774 B2 * | 7/2011 | Choi | ................. | H01L 23/49503 257/666 |
| 7,977,782 B2 * | 7/2011 | Camacho | .......... | H01L 23/49551 257/676 |
| 8,008,758 B1 * | 8/2011 | Kim | .................. | H01L 23/49541 257/666 |
| 8,772,923 B2 | 7/2014 | Minamio | | |
| 8,981,541 B2 * | 3/2015 | Tiu | .................... | H01L 23/49575 257/676 |
| 2008/0122049 A1 | 5/2008 | Zhao et al. | | |

* cited by examiner

*Primary Examiner* — Luan C Thai
(74) *Attorney, Agent, or Firm* — Charles E. Bergere

(57) ABSTRACT

A semiconductor device is assembled from a lead frame. The device has a semiconductor die mounted on a flag of the lead frame. A mold compound forms a housing that covers the die. Lead fingers surround the die. Each lead finger has an inner lead length that is covered by the housing and an outer lead length that protrudes from the housing. The inner lead length extends from an edge of the housing towards the die. The inner lead length has an intermediate region that has been bent to form a notch. Bond wires electrically connect electrodes of the die to respective inner lead lengths.

8 Claims, 5 Drawing Sheets

SEMICONDUCTOR DEVICE HAVING LEAD FRAME WITH NOTCHED INNER LEADS

BACKGROUND OF THE INVENTION

The present invention relates generally to integrated circuit packaging and, more particularly, to a lead frame for a semiconductor packages.

Semiconductor die packaging provides for suitable external electrical connections and protection of a semiconductor die against mechanical and environmental stresses. Continued progress in reduction of the size of the semiconductor dies and increased functionality and complexity of the circuits integrated in the dies require size reduction of the packaging.

Typical types of semiconductor die packages are Quad Flat Package (QFP), which are formed with a semiconductor die mounted to a lead frame. The lead frame is formed from a sheet of metal, and has a die attach pad often called a flag that is attached to a frame with tie bars, and leads that surround the flag. Inner ends of the leads are wire bonded to electrodes of the die (die bond pads), and outer ends of the leads extend or project out of a package body. The outer lead ends provide a means of electrically connecting the die to circuit boards and the like. After the die bond pads and the inner leads are electrically connected with bond wires, the semiconductor die, bond wires and inner lead ends are encapsulated in a mold compound, with the outer lead ends exposed. These exposed or external leads are cut from the frame of the lead frame (singulated) and bent for ease of connection to a circuit board.

Once the semiconductor die and inner lead ends are encapsulated, the exposed leads are typically plated with tin. However, during the plating process gasses, such as hydrogen, are emitted which can separate (delaminate) the encapsulated regions of the leads from the mold compound. This delamination reduces the structural integrity and rigidity of the leads and may also allow moisture to access and corrode the bond wires.

BRIEF DESCRIPTION OF THE DRAWINGS

The invention, together with objects and advantages thereof, may best be understood by reference to the following description of preferred embodiments together with the accompanying drawings in which.

DETAILED DESCRIPTION OF PREFERRED EMBODIMENTS

Figure 1:
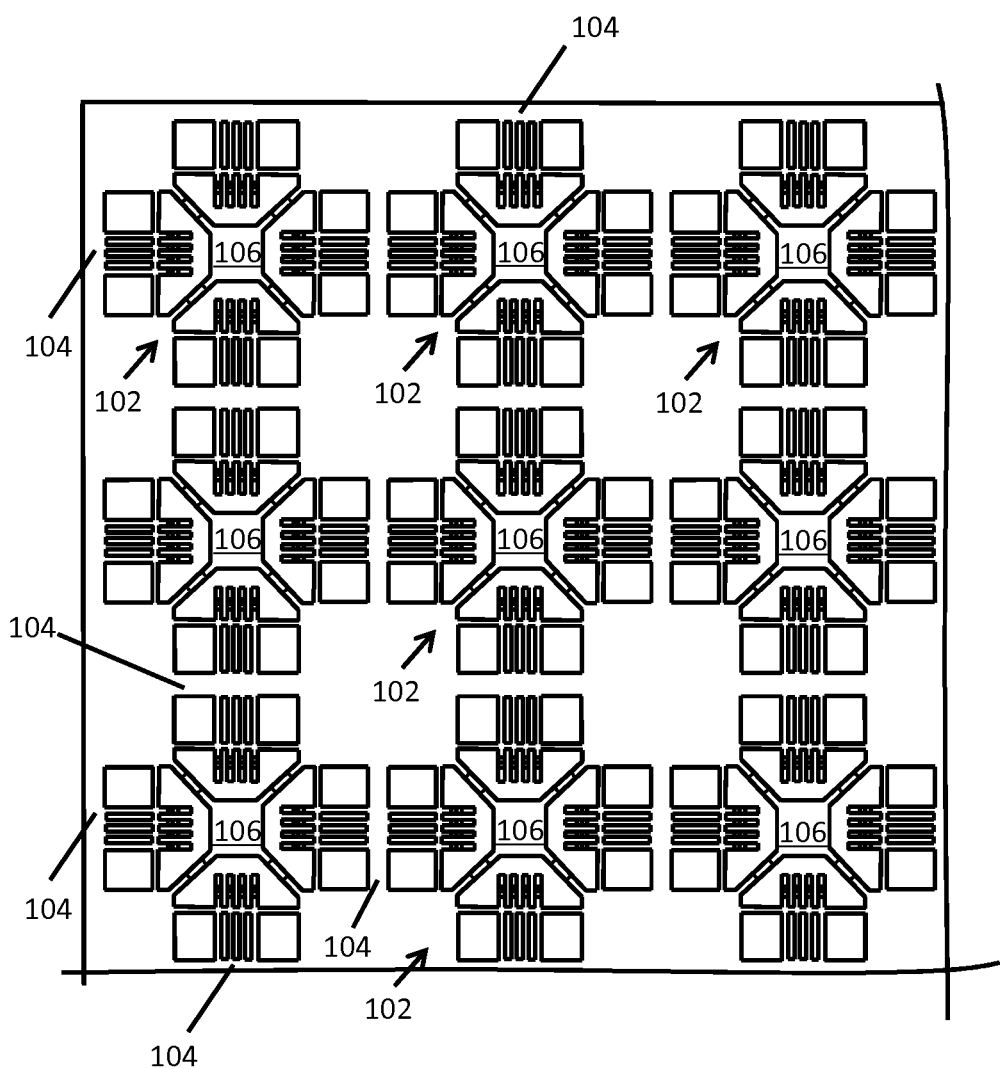
FIG. 1 is a partial plan view of a lead frame sheet according to a general embodiment of the present invention.

The detailed description set forth below in connection with the appended drawings is intended as a description of presently preferred embodiments of the invention, and is not intended to represent the only forms in which the present invention may be practised. It is to be understood that the same or equivalent functions may be accomplished by different embodiments that are intended to be encompassed within the spirit and scope of the invention. In the drawings, like numerals are used to indicate like elements throughout. Furthermore, terms "comprises," "comprising," or any other variation thereof, are intended to cover a non-exclusive inclusion, such that module, circuit, device components, structures and method steps that comprises a list of elements or steps does not include only those elements but may include other elements or steps not expressly listed or inherent to such module, circuit, device components or steps. An element or step proceeded by "comprises . . . a" does not, without more constraints, preclude the existence of additional identical elements or steps that comprises the element or step.

In one embodiment, the present invention provides a lead frame sheet with an array of lead frames formed therein. Each of the lead frames has a die pad or flag surrounded by a frame. The flag is connected to the frame with tie bars that extend inwardly from the surrounding frame and support the flag. Dam bars are provided that define an external package housing outline. Each of the dam bars is supported by the surrounding frame. Each lead frame also includes lead fingers each having an inner lead length extending from one of the dam bars towards the die flag and an outer lead length extending from the dam bars away from the flag and towards the outer frame. The inner lead length has an intermediate region that has been bent to form a notch.

In another embodiment, the present invention provides a semiconductor die package having a semiconductor die mounted on a die flag. A mold compound forms a housing that covers the semiconductor die. Lead fingers, each having an inner lead length that is covered by the mold compound and an outer lead length protruding from the mold compound are provided. The inner lead lengths extend from an edge of the housing (mold compound) towards the die flag, and the inner lead lengths have an intermediate region that has been bent to form a notch. Bond wires selectively electrically connect electrodes of the semiconductor die to a respective inner lead length.

Referring now to FIG. 1, a partial plan view of a lead frame sheet 100 according to a general embodiment of the present invention is shown. The lead frame sheet 100 is typically formed from metal such as copper and thus is both thermally and electrically conducive. The lead frame sheet 100 has a plurality of lead frames 102 in an array and the lead frames 102 are typically formed by punching or cutting out regions of the lead frame sheet 100. Each of the lead frames 102 has an outer surrounding frame 104 that surrounds a centrally located flag 106 that is supported by the surrounding frame 104.

Figure 2:
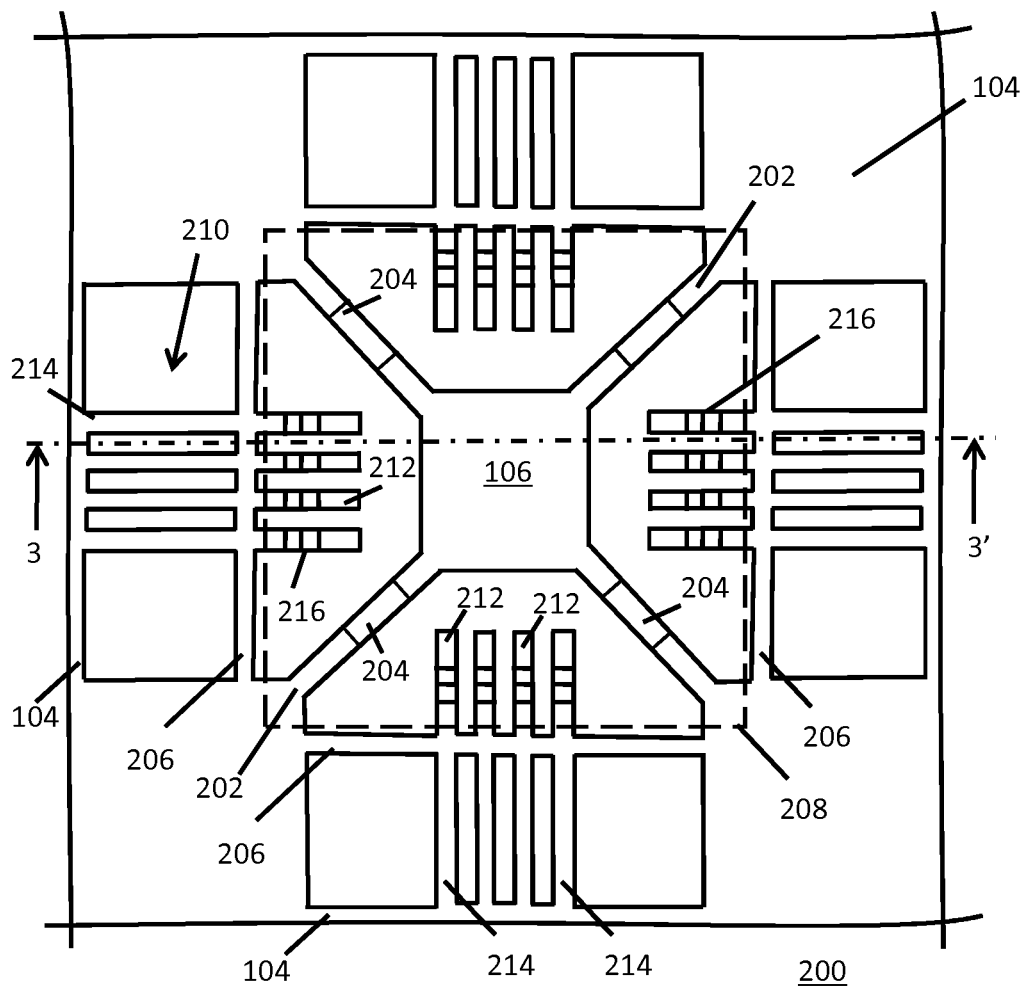
FIG. 2 is a plan view of a single lead frame of the lead frame sheet FIG. 1 in accordance with a first embodiment of the present invention.

FIG. 2 is a plan view of a single lead frame 200, which is one of the lead frames of the lead frame sheet 100, according to a first embodiment of the present invention. In this embodiment the there are tie bars 202 that extend inwardly from the surrounding frame 104 and support the flag 106. The tie bars 202 each have an angled section 204 that is angled to form a down-set relationship between the flag 106 and surrounding frame 104.

The illustrated lead frame 200 includes dam bars 206 defining an external package housing outline 208, indicated in phantom, wherein each of the dam bars 206 bridges two of the tie bars 108 and each of the dam bars 206 is therefore supported by the surrounding frame 104.

The illustrated lead frame 200 includes lead fingers 210 each having an inner lead length 212 extending from one of the dam bars 206 towards the flag 106. Each of the lead fingers 210 also has an outer lead length 214 extending from a respective dam bar 206 away from the flag 106 and towards the outer frame 104. Also, in the embodiment each outer lead length 214 is attached directly to the outer frame 104, however in an alternative embodiment a free end of the outer lead length 214 may be spaced from the outer frame 104. Also, in this embodiment the inner lead length 212 of each of the lead fingers 210 has an intermediate region that has been bent to form a notch 216.

Figure 3:
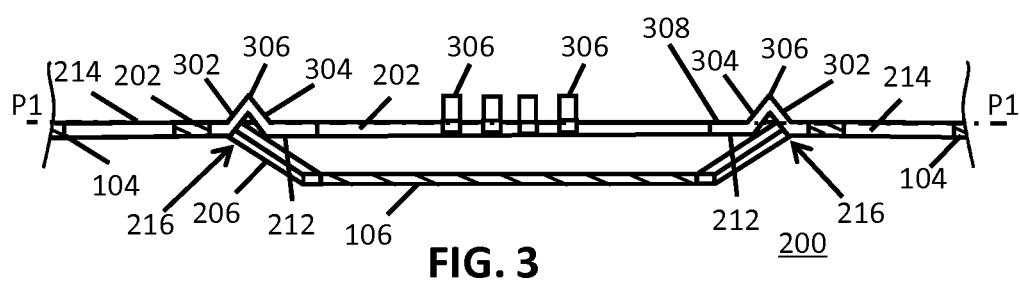
FIG. 3 is a cross-sectional side view through 3-3' of the lead frame of FIG. 2.

FIG. 3 is a cross-sectional side view through 3-3' of the lead frame 200, according to the first embodiment of the present invention. In this embodiment, the notch 216 includes two sloping walls 302, 304 meeting at an apex 306 of the notch 216. Further, the sloping walls 302, 304 extend above an upper surface 308 of the inner lead length 212 and the inner lead length 212 either side of the notch 216 is coplanar as indicated by plane P1.

Figure 4:
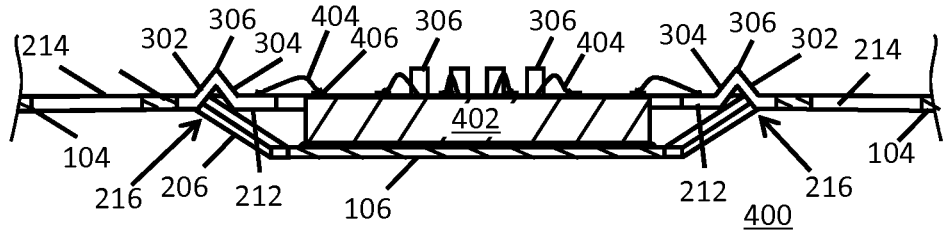
FIG. 4 is a cross-sectional view of a wire bonded lead frame assembly formed from the lead frame of FIG. 2, according to the first embodiment of the present invention.

FIG. 4 is a cross-sectional view of a wire bonded lead frame assembly 400 formed from the lead frame 200, according to the first embodiment of the present invention. The lead frame assembly 400 includes a semiconductor die 402 that is mounted on the flag 106. There are bond wires 404 that provide for selectively electrically connecting electrodes 406 of the semiconductor die 402 an end of each of inner lead lengths 212.

Figure 5:
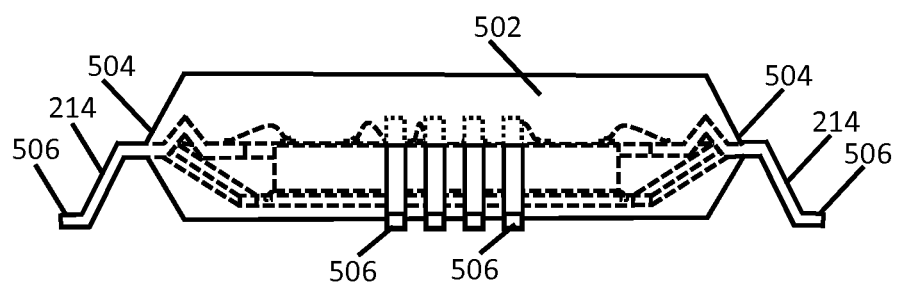
FIG. 5 is a side view of a semiconductor die package, formed from the wire bonded lead frame assembly of FIG. 4, according to the first embodiment of the present invention.

FIG. 5 is a side view of a semiconductor die package 500, formed from the wire bonded lead frame assembly 400, according to the first embodiment of the present invention. The semiconductor die package 500 includes a mold compound forming a housing 502 that covers the semiconductor die 402, bond wires 404 and each inner lead length 212. Each inner lead length 212 extends from an edge 504 of the housing 502 towards the flag 106 and each outer lead length 214 protrudes from the housing 502. As will be apparent to a person skilled in the art, the flag 106 has been severed from the tie bars 202 and the lead fingers 210 have been severed from the dam bars 206 and also from the outer surrounding frame 104 by a singulation procedure. Further, a free end of each outer lead length 214 has been bent to form a mounting foot 506.

Figure 6:
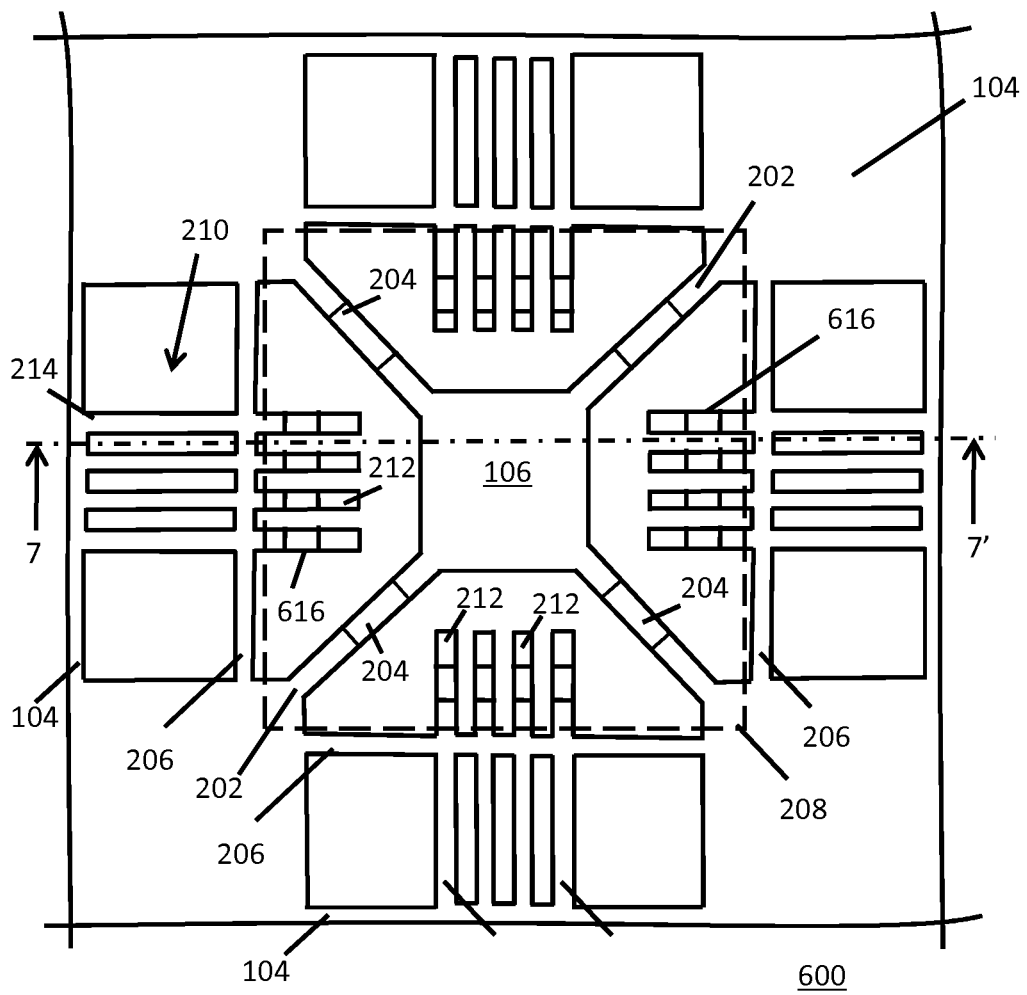
FIG. 6 is a plan view of a single lead frame of the lead frame sheet FIG. 1 in accordance with a second embodiment of the present invention.
Figure 7:
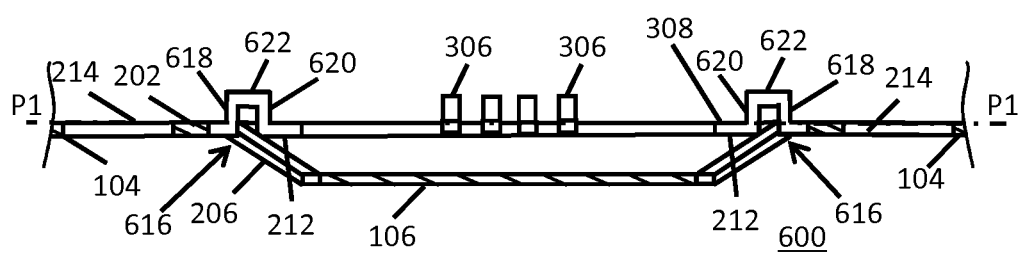
FIG. 7 is a cross-sectional side view through 7-7' of the lead frame of FIG. 6.

Referring to FIGS. 6 and 7, a single lead frame 600, which is one of the lead frames of the lead frame sheet 100, according to a second embodiment of the present invention, is shown. The lead frame 600 is similar to the lead frame 200 and to avoid repetition only the differences will be described. In this second embodiment the inner lead length 212 of each of the lead fingers 210 has an intermediate region that has been bent to form a notch 616. The notch 616 includes two upright walls 618, 620 spaced by a horizontal wall 622 wherein both upright walls 618, 620 extend above an upper surface 308 of the inner lead length 212. Also, the inner lead length 212 either side of the notch 216 is coplanar as indicated by plane P1.

Figure 8:
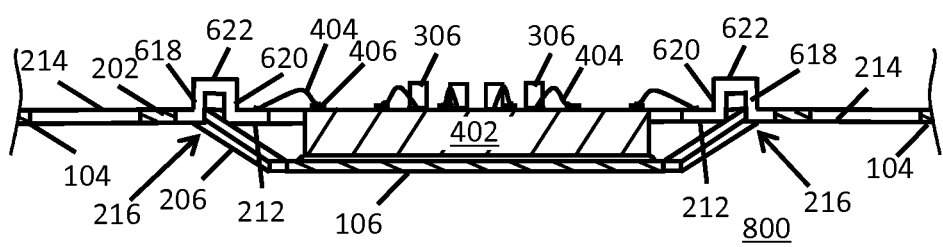
FIG. 8 is a cross-sectional view of a wire bonded lead frame assembly formed from the lead frame of FIG. 6 in accordance with the second embodiment of the present invention.

FIG. 8 is a cross-sectional view of a wire bonded lead frame assembly 800 formed from the lead frame 600, according to the second embodiment of the present invention. The lead frame assembly 800 includes a semiconductor die 402 that is mounted on the flag 106. There are bond wires 404 that provide for selectively electrically connecting electrodes 406 of the semiconductor die 402 an end of each of inner lead lengths 212.

Figure 9:
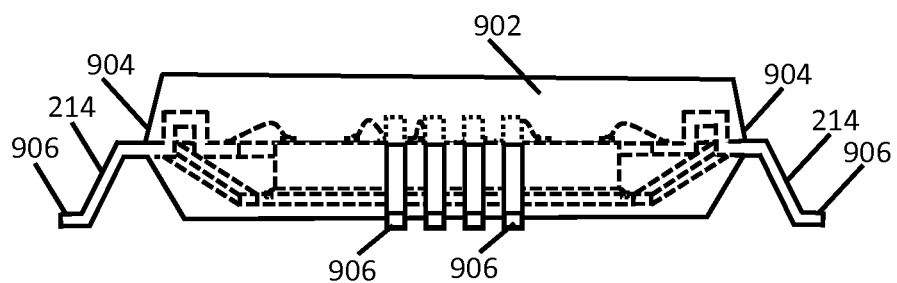
FIG. 9 is a side view of a semiconductor die package, formed from the wire bonded lead frame assembly of FIG. 8, in accordance with the second embodiment of the present invention.

FIG. 9 is a side view of a semiconductor die package 900, formed from the wire bonded lead frame assembly 800, according to the second embodiment of the present invention. The semiconductor die package 800 includes a mold compound forming a housing 902 that covers the semiconductor die 402, bond wires 404 and each inner lead length 212. Each inner lead length 212 extends from an edge 904 of the housing 902 towards the flag 106 and each outer lead length 214 protrudes from the housing 902. As will be apparent to a person skilled in the art, the flag 106 has been severed from the tie bars 202 and the lead fingers 210 have been severed from the dam bars 206 and also from the outer surrounding frame 104 by a singulation procedure. Further, a free end of each outer lead length 214 has been bent to form a mounting foot 506.

Figure 10:
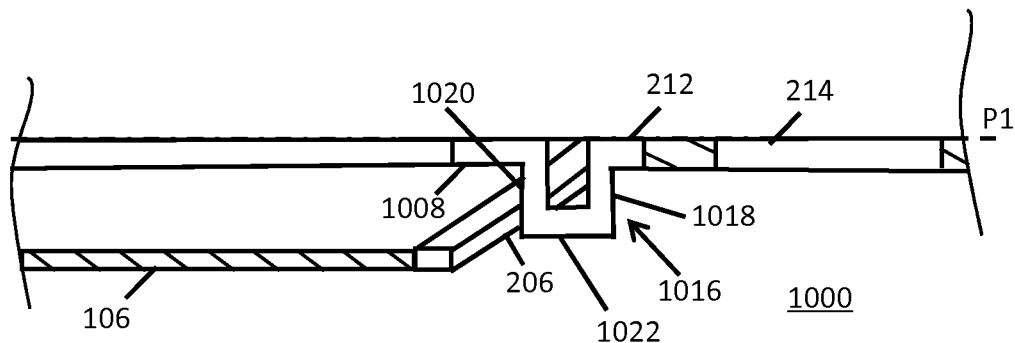
FIG. 10 is a cross-sectional side view of part of a lead frame according to a third embodiment of the present invention.

FIG. 10 is a cross-sectional side view of part of a lead frame 1000 according to a third embodiment of the present invention. In this third embodiment the inner lead length 212 of each of the lead fingers 210 has an intermediate region that has been bent to form a notch 1016. The notch 1016 includes two upright walls 1018, 1020 spaced by a horizontal wall 1022 wherein both upright walls 1018, 1020 extend below a lower surface 1008 of the inner lead length 212. Also, the inner lead length 212 either side of the notch 1016 is coplanar as indicated by plane P1. The lead frame 1000 can be used to form a semiconductor die package similar to package 500 or 900 as will be apparent to a person skilled in the art.

Figure 11:
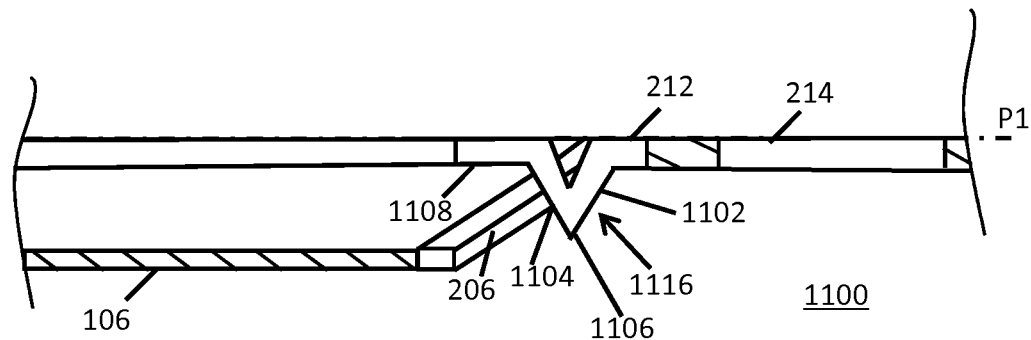
FIG. 11 is a cross-sectional side view of part of a lead frame according to a fourth embodiment of the present invention.

FIG. 11 is a cross-sectional side view of part of a lead frame 1100 according to a fourth embodiment of the present invention. In this fourth embodiment the inner lead length 212 of each of the lead fingers 210 has an intermediate region that has been bent to form a notch 1116. The notch 1116 includes two sloping walls 1102, 1104 meeting at an apex 1106 of the notch 1116. Further, the sloping walls 1102, 1104 extend below a lower surface 1108 of the inner lead length 212, and the inner lead length 212 either side of the notch 1116 is coplanar as indicated by plane P1. The lead frame 1100 can be used to form a semiconductor die package similar to package 500 or 900 as will be apparent to a person skilled in the art.

Figure 12:
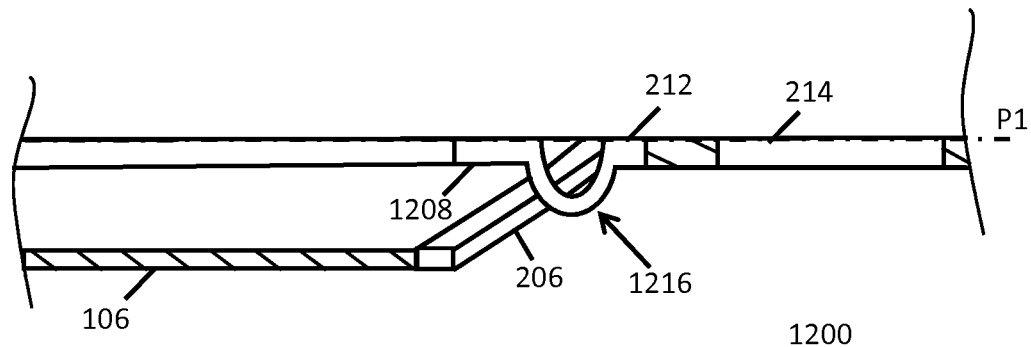
FIG. 12 is a cross-sectional side view of part of a lead frame according to a fifth embodiment of the present invention.

FIG. 12 is a cross-sectional side view of part of a lead frame 1200 according to a fifth embodiment of the present invention. In this fifth embodiment the inner lead length 212 of each of the lead fingers 210 has an intermediate region that has been bent to form a notch 1216. The notch 1216 is arcuate when viewed in this side view and walls of the notch 1216 extend below a lower surface 1208 of the inner lead length 212, and the inner lead length 212 either side of the notch 1216 is coplanar as indicated by plane P1. The lead frame 1200 can be used to form a semiconductor die package similar to package 500 or 900 as will be apparent to a person skilled in the art.

Figure 13:
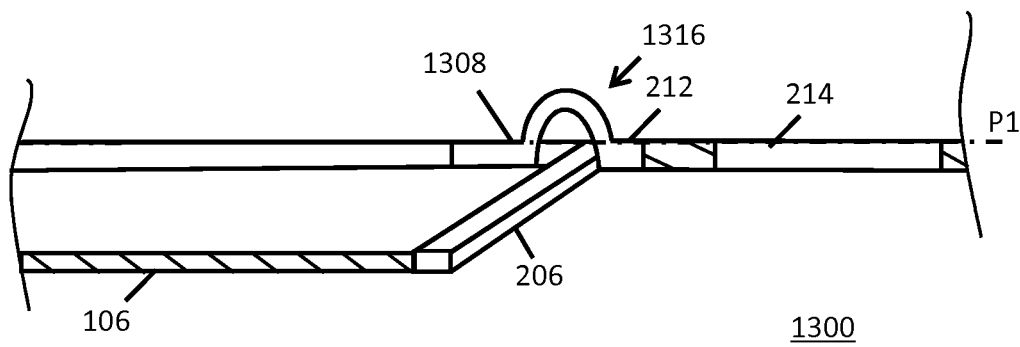
FIG. 13 is a cross-sectional side view of part of a lead frame according to a sixth embodiment of the present invention.

Referring to FIG. 13, a cross-sectional side view of part of a lead frame 1300 according to a sixth embodiment of the present invention is shown. In this sixth embodiment the inner lead length 212 of each of the lead fingers 210 has an intermediate region that has been bent to form a notch 1316. The notch 1316 is arcuate when viewed in this side view and walls of the notch 1316 extend above an upper surface 1308 of the inner lead length 212, and the inner lead length 212 either side of the notch 1316 is coplanar as indicated by plane P1. The lead frame 1300 can be used to form a semiconductor die package similar to package 500 or 900 as will be apparent to a person skilled in the art.

The present invention provides for increasing the effective lengths of the inner lead lengths of semiconductor die packages. The inner lead lengths are also notched and provide protective moisture barriers. As a result the present invention advantageously reduces or alleviates at least one of the problems caused by the effects of hydrogen gas emissions during plating of outer lead lengths (the external leads) of semiconductor die packages.

The description of the preferred embodiments of the present invention has been presented for purposes of illustration and description, but is not intended to be exhaustive or to limit the invention to the forms disclosed. It will be appreciated by those skilled in the art that changes could be made to the embodiments described above without departing from the broad inventive concept thereof. It is understood, therefore, that this invention is not limited to the particular embodiment disclosed, but covers modifications within the spirit and scope of the present invention as defined by the appended claims.

The invention claimed is:

1. A lead frame sheet with an array of lead frames formed therein, each of the lead frames comprising:
   a die flag surrounded by a frame;
   tie bars extending inwardly from the frame and supporting the die flag;
   dam bars defining an external package housing outline, wherein each of the dam bars is supported by the surrounding frame; and
   lead fingers each having an inner lead length extending from one of the dam bars towards the die mount and an outer lead length extending from said one of the dam bars away from the die mount and towards the outer frame,
   wherein the inner lead length has an intermediate region that has been bent to form a notch, wherein the notch includes two straight sloping walls meeting at an apex of the notch.

2. The lead frame sheet of claim 1, wherein the straight sloping walls extend above an upper surface of the inner lead length.

3. The lead frame sheet of claim 1, wherein the straight sloping walls extend below a lower surface of the inner lead length.

4. The lead frame sheet of claim 1, wherein the inner lead length either side of the notch is coplanar.

5. A semiconductor die package, comprising:
   a semiconductor die mounted on a die flag;
   a mold compound forming a housing that covers the semiconductor die;
   lead fingers each having an inner lead length covered by the housing and an outer lead length protruding from the housing, wherein the inner lead lengths extend from an edge of the housing towards the die flag, and wherein the inner lead lengths have an intermediate region having a bend that forms a notch, wherein the notch includes two straight sloping walls meeting at an apex of the notch, and wherein the notch is covered by the mold compound; and
   bond wires electrically connecting electrodes of the semiconductor die to the inner lead lengths.

6. The semiconductor die package of claim 5, wherein the straight sloping walls extend above an upper surface of the inner lead length.

7. The semiconductor die package of claim 5, wherein the straight sloping walls extend below a lower surface of the inner lead length.

8. The semiconductor die package of claim 5, wherein the inner lead length either side of the notch is coplanar.

* * * * *